(12) United States Patent
Jeong et al.

(10) Patent No.: US 11,048,467 B2
(45) Date of Patent: Jun. 29, 2021

(54) ELECTRONIC DEVICE WITH DISPLAY PANEL SPEAKER

(71) Applicant: Samsung Electronics Co., Ltd., Suwon-si (KR)

(72) Inventors: Wontae Jeong, Suwon-si (KR); Eungkyu Park, Suwon-si (KR); Dongyeop Lee, Suwon-si (KR); Jaehwan Lee, Suwon-si (KR); Hyounggil Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/738,779

(22) Filed: Jan. 9, 2020

(65) Prior Publication Data
US 2020/0218498 A1    Jul. 9, 2020

(30) Foreign Application Priority Data
Jan. 9, 2019    (KR) .................. 10-2019-0002702

(51) Int. Cl.
*G06F 3/16*    (2006.01)
*H01L 27/32*    (2006.01)
(Continued)

(52) U.S. Cl.
CPC .............. *G06F 3/16* (2013.01); *G06F 1/1605* (2013.01); *G10K 9/122* (2013.01); *H01L 27/3225* (2013.01)

(58) Field of Classification Search
CPC ........ G06F 3/16; G06F 1/1605; G06F 1/1601; G10K 9/122; H01L 27/3225;
(Continued)

(56) References Cited

U.S. PATENT DOCUMENTS 9,326,057 B2    4/2016    Lee
9,420,363 B2    8/2016    Seo et al.
(Continued)

FOREIGN PATENT DOCUMENTS

KR    10-1094867 B1    12/2011
KR    10-2014-0050912 A    4/2014
KR    10-2018-0092219 A    8/2018

OTHER PUBLICATIONS

International Search Report dated Apr. 28, 2020 in connection with International Patent Application No. PCT/KR2020/000337, 3 pages.
(Continued)

*Primary Examiner* — Hai Phan
*Assistant Examiner* — Anthony D Afrifa-Kyei

(57) ABSTRACT

An electronic device including a housing including a first plate facing a first direction, a second plate facing opposite to the first direction, and a side surface member surrounding a portion of a space between the first and second plates; a display panel disposed in a second direction of the first plate, and visually disposed through at least a portion of the first plate; a speaker disposed on one surface of the display panel facing in the second direction; a bracket including a first surface facing in the first direction and a second surface facing in the second direction, and disposed to support the display panel on the first surface; and a bonding configured to attach the display panel and the bracket. The bonding layer includes a gap formed by deleting a portion of the bonding layer to receive the speaker, and formed between the display panel and the bracket.

20 Claims, 15 Drawing Sheets

(51) Int. Cl.
*G10K 9/122* (2006.01)
*G06F 1/16* (2006.01)

(58) Field of Classification Search
CPC ......... H01L 27/3276; G09F 9/33; G09F 9/00; G09F 9/30; H05K 5/0017; H05K 5/0008; H05K 5/0247; H05K 5/03; H05K 7/20972
See application file for complete search history.

(56) References Cited

U.S. PATENT DOCUMENTS

| | | |
|---|---|---|
| 9,699,568 B2 * | 7/2017 | Park .................... H01L 41/0906 |
| 10,440,470 B2 | 10/2019 | Park et al. |
| 2009/0167990 A1 * | 7/2009 | Konno ................. G09G 3/3426 349/65 |
| 2009/0304221 A1 | 12/2009 | Lin |
| 2010/0225600 A1 | 9/2010 | Dai et al. |
| 2014/0029779 A1 | 1/2014 | Yamauchi et al. |
| 2019/0014670 A1 * | 1/2019 | Lee .................... H01L 51/5237 |

OTHER PUBLICATIONS

Written Opinion of the International Searching Authority dated Apr. 28, 2020 in connection with International Patent Application No. PCT/KR2020/000337, 5 pages.

* cited by examiner

ELECTRONIC DEVICE WITH DISPLAY PANEL SPEAKER

CROSS-REFERENCE TO RELATED APPLICATION

This application is based on and claims priority under 35 U.S.C. § 119 to Korean Patent Application No. 10-2019-0002702, filed on Jan. 9, 2019, in the Korean Intellectual Property Office, the disclosure of which is herein incorporated by reference in its entirety.

BACKGROUND

1. Field

Various embodiments of the disclosure relate to a coupling structure between a display panel having a speaker attached thereto and a bracket.

2. Description of Related Art

An electronic device may have one or more speakers disposed in a main body thereof, and for example, speakers which are disposed on an upper end and a lower end of the main body, respectively, and reproduce sounds in the form of stereo may be excellent in performance. Such an electronic device may remove the speaker disposed on the upper end of the main body in order to realize a fill screen of a display panel.

To achieve this, a display panel speaker which directly radiates a sound by vibrating the display panel may be used. The display panel speaker may be substituted for the speaker disposed on the upper end of the main body.

Since the display panel speaker directly radiates a sound to the outside by vibrating the display panel, the display panel speaker does not require a speaker hole structure or a sound tunnel structure to provide a separate sound path for radiating a sound like a coil-type speaker. Therefore, the display panel speaker is increasingly used in an electronic device having a display panel mounted thereon.

The display panel of this structure has the speaker directly attached to a rear surface thereof, and therefore, may be applied to an organic light emitting diode (OLED), but is not applicable to a liquid crystal display device requiring a separate light source.

The above information is presented as background information only to assist with an understanding of the disclosure. No determination has been made, and no assertion is made, as to whether any of the above might be applicable as prior art with regard to the disclosure.

SUMMARY

However, the electronic device including display panel speaker may have a problem that performance of the speaker in a specific acoustic band deteriorates due to a bonding structure between the display panel speaker and a bracket.

Various embodiments of the disclosure provide an electronic device which can enhance acoustic performance of a speaker in a low frequency band by implementing an assembly structure of a display panel which reduces vibration stiffness of the display panel.

An electronic device according to various embodiments of the disclosure includes: a housing including a first plate facing in a first direction, a second plate facing in a direction opposite to the first direction, and a side surface member surrounding at least a portion of a space between the first and second plates; a display panel disposed in a second direction of the first plate, and visually disposed through at least a portion of the first plate; a speaker disposed on one surface of the display panel facing in the second direction; a bracket including a first surface facing in the first direction and a second surface facing in the second direction, and disposed between the first and second plates to support the display panel disposed on the first surface; and a bonding layer having a first thickness and configured to attach the display panel and the bracket, and the bonding layer may include a gap which is formed by deleting a portion of the bonding layer to receive the speaker, and is formed between the display panel and the bracket.

An electronic device according to various embodiments includes: a housing including a first plate facing in a first direction, a second plate facing in a direction opposite to the first direction, and a side surface member surrounding at least a portion of a space between the first and second plates; a display panel disposed in a second direction of the first plate, and visually disposed through at least a portion of the first plate; a speaker disposed on one surface of the display panel facing in the second direction; a bracket including a first surface facing in the first direction and a second surface facing in the second direction, and disposed between the first and second plates to support the display panel disposed on the first surface; and a bonding layer having a first thickness and configured to attach the display panel and the bracket, and the bracket may include a gap which is formed by deleting a portion of the bracket to receive the speaker, and is formed between the bonding layer and the bracket.

An electronic device according to various embodiments of the disclosure includes: a housing including a first plate facing in a first direction, a second plate facing in a direction opposite to the first direction, and a side surface member surrounding at least a portion of a space between the first and second plates; a display panel disposed in a second direction of the first plate, and visually disposed through at least a portion of the first plate; a speaker disposed on one surface of the display panel facing in the second direction; a bracket including a first surface facing in the first direction and a second surface facing in the second direction, and disposed between the first and second plates to support the display panel disposed on the first surface; a bonding layer having a first thickness and configured to attach the display panel and the bracket; a first gap formed by deleting a portion of the bonding layer and formed between the display panel and the bracket; and a second gap formed by deleting the first surface of the bracket, and formed between the bonding layer and the bracket.

Before undertaking the DETAILED DESCRIPTION below, it may be advantageous to set forth definitions of certain words and phrases used throughout this patent document: the terms "include" and "comprise," as well as derivatives thereof mean inclusion without limitation; the term "or," inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
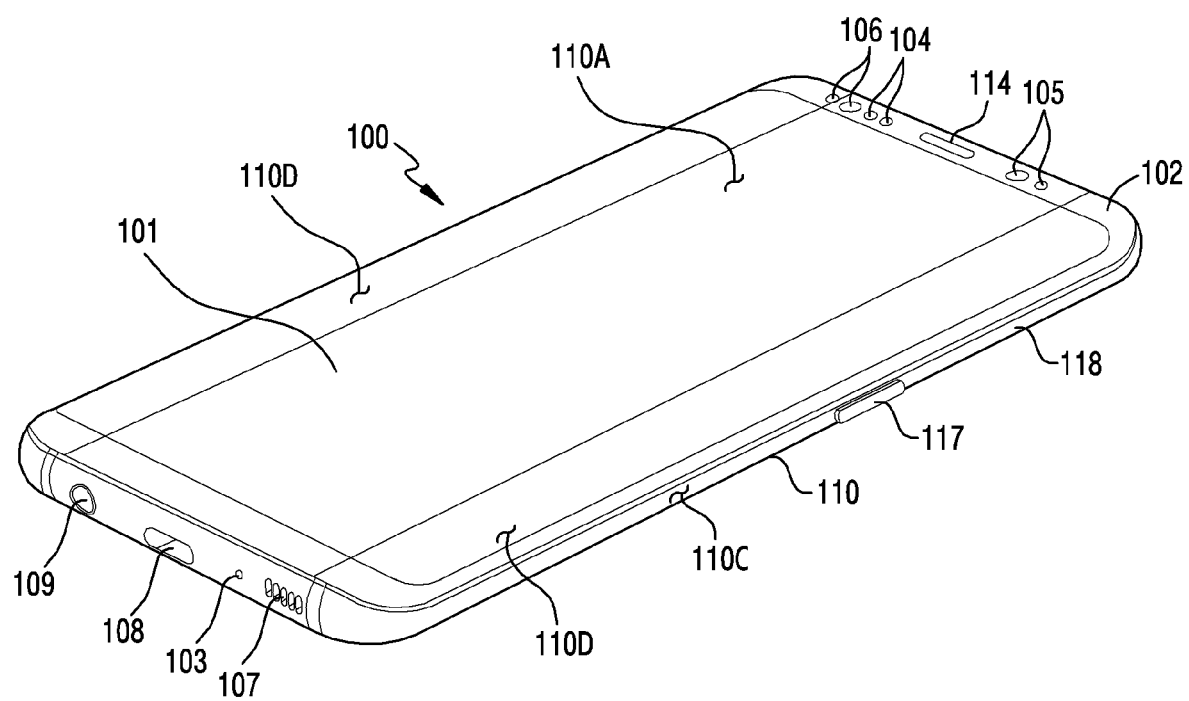
FIG. 1 is a perspective view illustrating a front surface of a mobile electronic device according to an embodiment.

FIGS. 1 through 12, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the disclosure will be described with reference to the accompanying drawings. It should be appreciated that various embodiments are not intended to limit the disclosure to particular embodiments, and include various modifications, equivalents, and/or alternatives of embodiments of the disclosure. With regard to the description of the drawings, similar reference numerals may be used to refer to similar elements.

An electronic device according to various embodiments of the disclosure may include at least one of, for example, smartphones, tablet personal computers (PCs), mobile phones, video telephones, electronic book readers, desktop PCs, laptop PCs, netbook computers, workstations, servers, personal digital assistant (PDAs), portable multimedia players (PMPs), Motion Picture Experts Group (MPEG-1 or MPEG-2) Audio Layer 3 (MP3) players, mobile medical devices, cameras, or wearable devices (for example, smart glasses, head-mounted-devices (HMDs), electronic apparels, electronic bracelets, electronic necklaces, electronic appcessory, electronic tattoos, smart mirrors, or smart watches).

Figure 2:
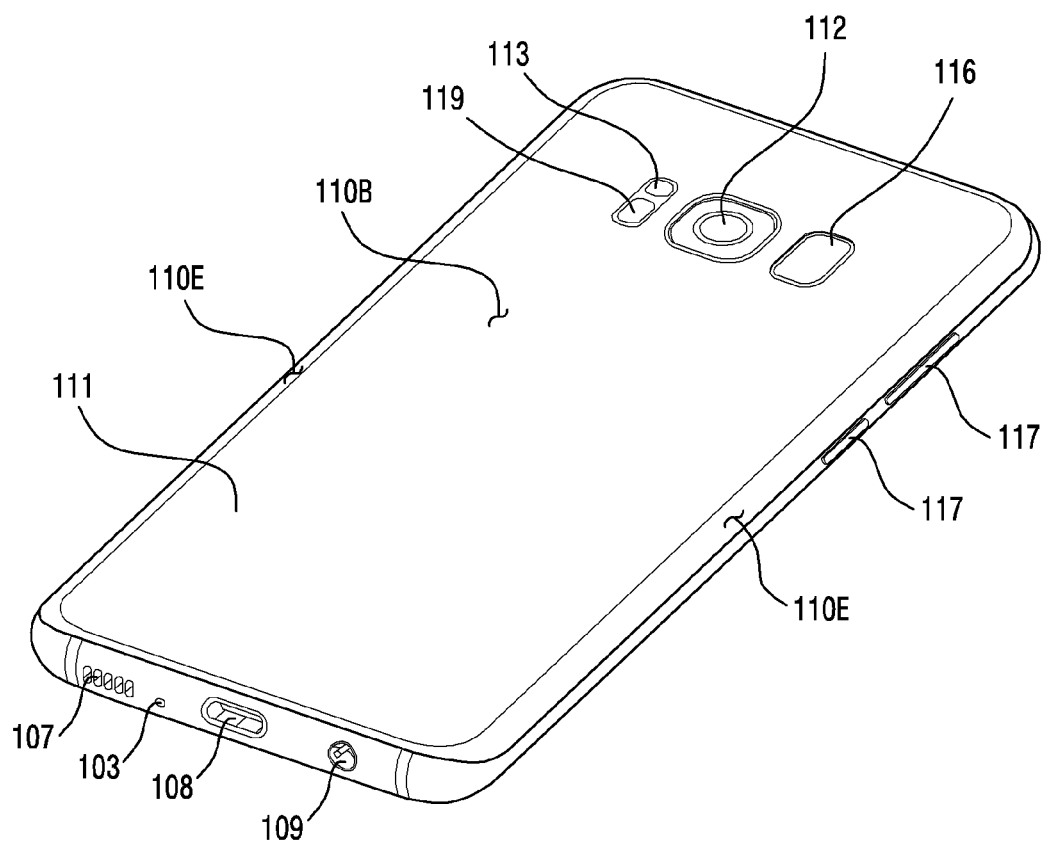
FIG. 2 is a perspective view illustrating a rear surface of the electronic device of FIG. 1.

FIG. 1 is a perspective view illustrating a front surface of a mobile electronic device according to an embodiment. FIG. 2 is a perspective view illustrating a rear surface of the electronic device of FIG. 1.

Referring to FIGS. 1 and 2, the electronic device 100 according to an embodiment may include a housing 110 including a first surface (or a front surface) 110A, a second surface (or a rear surface) 110B, and a side surface 100C surrounding a space between the first surface 110A and the second surface 110B. In another embodiment, the housing may refer structure which forms a part of the first surface 110A, the second surface 110B, and the side surface 110C. According to an embodiment, the first surface 110A may be formed by a front surface plate 102 having at least a portion substantially transparent (for example, a glass plate including various coating layers, or a polymer plate). The second surface 110B may be formed by a substantially opaque rear surface plate 111. The rear surface plate 111 may be formed by coated or colored glass, ceramic, polymer, metal (for example, aluminum, stainless steel (STS), or magnesium), or a combination of at least two of the above-mentioned materials. The side surface 110C may be formed by a side surface bezel structure (or a side surface member) 118 which is coupled with the front surface plate 102 and the rear surface plate 111, and includes metal and/or polymer. In a certain embodiment, the rear surface plate 111 and the side surface bezel structure 118 may be integrally formed with each other, and may include the same material (for example, a metallic material such as aluminum).

In the illustrated embodiment, the front surface plate 102 may include two first regions 110D which are bent from the first surface 110A toward the rear surface plate 111 and are extended seamlessly on both ends of long edges of the front surface plate 102. In the illustrated embodiment (see FIG. 2), the rear surface plate 111 may include two second regions 110E which are bent from the second surface 110B toward the front surface plate 102 and are extended seamlessly on both ends of long edges. In a certain embodiment, the front surface plate 102 (or the rear surface plate 111) may include only one of the first regions 110D (or the second regions 110E). In another embodiment, a portion of the first regions 110D or the second regions 110E may not be included. In the embodiments, when viewed from the side of the electronic device 100, the side surface bezel structure 118 may have a first thickness (width) on a side surface that does not include the first regions 110D or the second regions 110E, and may have a second thickness which is thinner than the first thickness on a side surface that includes the first regions 110D or the second regions 110E.

According to an embodiment, the electronic device 100 may include at least one of a display 101, an audio module 103, 107, 114, a sensor module 104, 116, 119, a camera module 105, 112, 113, a key input device 117, a light emitting element 106, and a connector hole 108, 109. In a certain embodiment, the electronic device 100 may omit at least one of the elements (for example, the key input device 117, or the light emitting element 106), or may further include other elements.

The display 101 may be exposed through a corresponding portion of the front surface plate 102, for example. In a certain embodiment, at least a portion of the display 101 may be exposed through the front surface plate 102 which forms the first surface 110A and the first regions 110D of the side surface 110C. In a certain embodiment, a corner of the display 101 may be formed substantially the same as shapes of adjacent outer portions of the front surface plate 102. In another embodiment a distance between an outer portion of the display 101 and the outer portion of the front surface plate 102 may be formed to be substantially the same as in order to expand an exposed area of the display 101.

In another embodiment, a recess or an opening may be formed on a portion of a screen display region of the display 101, and the electronic device 100 may include at least one of the audio module 114, the sensor module 104, the camera module 105, and the light emitting element 106 which are aligned with the recess or opening. In another embodiment, the electronic device 100 may include, on a rear surface of the screen display region of the display 101, at least one of the audio module 114, the sensor module 104, the camera module 105, the fingerprint sensor 116, and the light emitting element 106. In another embodiment, the display 101 may be coupled with or disposed adjacent to a touch sensing circuit, a pressure sensor for measuring an intensity of a touch (pressure), and/or a digitizer for detecting a stylus pen in a magnetic field method. In a certain embodiment, at least a part of the sensor module 104, 119, and/or at least a part of the key input device 117 may be disposed on the first regions 110D and/or the second regions 110E.

The audio module 103, 107, 114 may include a microphone hole 103 and a speaker hole 107, 114. The microphone hole 103 may have a microphone disposed therein to obtain an external sound, and in a certain embodiment, a plurality of microphones may be disposed to detect a direction of a sound. The speaker hole 107, 114 may include an external speaker hole 107 and a call receiver hole 114. In a certain embodiment, the speaker hole 107, 114 and the microphone hole 103 may be implemented as one hole or the electronic device 100 may include a speaker without the speaker hole 107, 114.

The sensor module 104, 116, 119 may generate an electric signal or a data value corresponding to an operation state of the inside of the electronic device 100, or an external environment state. The sensor module 104, 116, 119 may include, for example, a first sensor module 104 (for example, a proximity sensor) and/or a second sensor module (for example, a fingerprint sensor) which is disposed on the first surface 110A of the housing 110, and/or a third sensor module 119 (for example, an HRM sensor) and/or a fourth sensor module 116 (for example, a fingerprint sensor) which is disposed on the second surface 110B of the housing 110. The fingerprint sensor may be displayed not only on the first surface 110A (for example, the display 101) of the housing 110 but also on the second surface 110B. The electronic device 100 may further include a sensor module which is not shown, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera module 105, 112, 113 may include a first camera device 105 which is disposed on the first surface 110A of the electronic device 100, and a second camera device 112 and/or a flash 113 which is disposed on the second surface HOB. The camera devices 105, 112 may include one or more lenses, an image sensor, and/or an image signal processor. The flash 113 may include, for example, a light emitting diode or a xenon lamp. In a certain embodiment, two or more lenses (an IR camera, a wide angle and telephoto lens), and image sensors may be disposed on one surface of the electronic device 100.

The key input device 117 may be disposed on the side surface 100C of the housing 110. In another embodiment, the electronic device 100 may not include a portion or an entirety of the above-mentioned key input device 117, and the key input device 117 that is not included may be implemented on the display 101 in other forms s as a soft key or the like. In a certain embodiment, the key input device may include the sensor module 116 disposed on the second surface 110B.

The light emitting element 106 may be disposed on, for example, the first surface 110A of the housing 110. The light emitting element 106 may provide state information of the electronic device 100 in the form of light, for example. In another embodiment, the light emitting element 106 may provide a light source which is associated with an operation of the camera module 105. The light emitting element 106 may include, for example, a light emitting diode (LED), an IR LED, and a xenon lamp.

The connector hole 108, 109 may include a first connector hole 108 to receive a connector (for example, a USB connector) for transmitting and receiving power and/or data to and from an external electronic device, and/or a second connector hole (for example, an earphone jack) 109 to receive a connector for transmitting and receiving an audio signal to and from an external electronic device.

Figure 3:
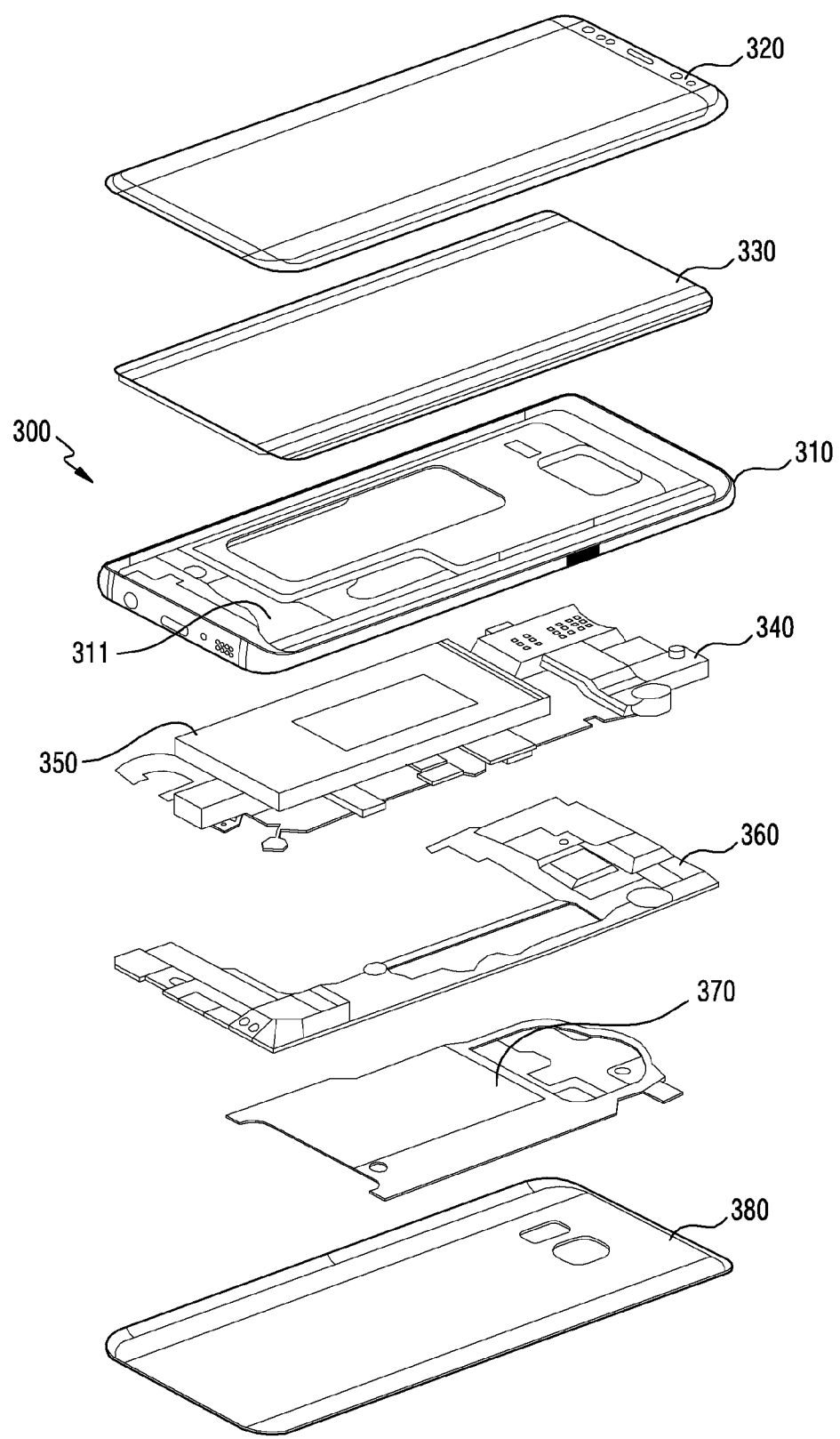
FIG. 3 is an exploded perspective view illustrating an inner configuration of the electronic device of FIG. 1.

FIG. 3 is an exploded perspective view illustrating an inner configuration of the electronic device of FIG. 1.

Referring to FIG. 3, the electronic device 300 may include a side surface bezel structure 310, a first support member 311 (for example, a bracket), a front surface plate 320, a display 330, a printed circuit board 340, a battery 350, a second support member 360 (for example, a rear case), an antenna 370, and a rear surface plate 380. In a certain embodiment, the electronic device 300 may omit at least one of the elements (for example, the first support member 311, or the second support member 360), or may further include other elements. At least one of the elements of the electronic device 300 may be the same as or similar to at least one of the elements of the electronic device 100 of FIG. 1 or 2, and a redundant explanation is omitted.

The first support member 311 may be disposed inside the electronic device 300, and may be connected with the side surface bezel structure 310 or may be integrally formed with the side surface bezel structure 310. The first support member 311 may be formed with, for example, a metallic material and/or a non-metallic material (for example, polymer). The first support member 311 may have one surface to which the display 330 is coupled, and the other surface to which the printed circuit board 340 is coupled. The printed circuit board 340 may have a processor, a memory, and/or an interface mounted therein. The processor may include, for example, one or more of a central processing unit, an application processor, a graphic processing unit, an image signal processor, a sensor hub processor, or a communication processor.

The memory may include, for example, a volatile memory or a non-volatile memory.

The interface may include, for example, a high definition multimedia interface (HDMI), a universal serial bus (USB) interface, an SD card interface, and/or an audio interface. The interface may electrically or physically connect the electronic device 300 to an external electronic device, and may include a USB connector, an SD card/MMC connector, or an audio connector.

The battery 350 may be a device which supplies power to at least one element of the electronic device 300, and may include, for example, a primary battery which is not rechargeable, or a rechargeable secondary battery, or a fuel battery. At least a portion of the battery 350 may be disposed substantially on the same plane as the printed circuit board 340. The battery 350 may be integrally disposed inside the electronic device 300, or may be disposed to be attachable to and detachable from the electronic device 300.

The antenna 370 may be disposed between the rear surface plate 380 and the battery 350. The antenna 370 may include, for example, a near field communication (NFC) antenna, a wireless charging antenna, and/or a magnetic secure transmission (MST) antenna. The antenna 370 may perform short range communication with an external device, or may wirelessly transmit and receive power for charging. In another embodiment, an antenna structure may be formed by a part or a combination of the side surface bezel structure 310 and/or the first support member 311.

Figure 4A:
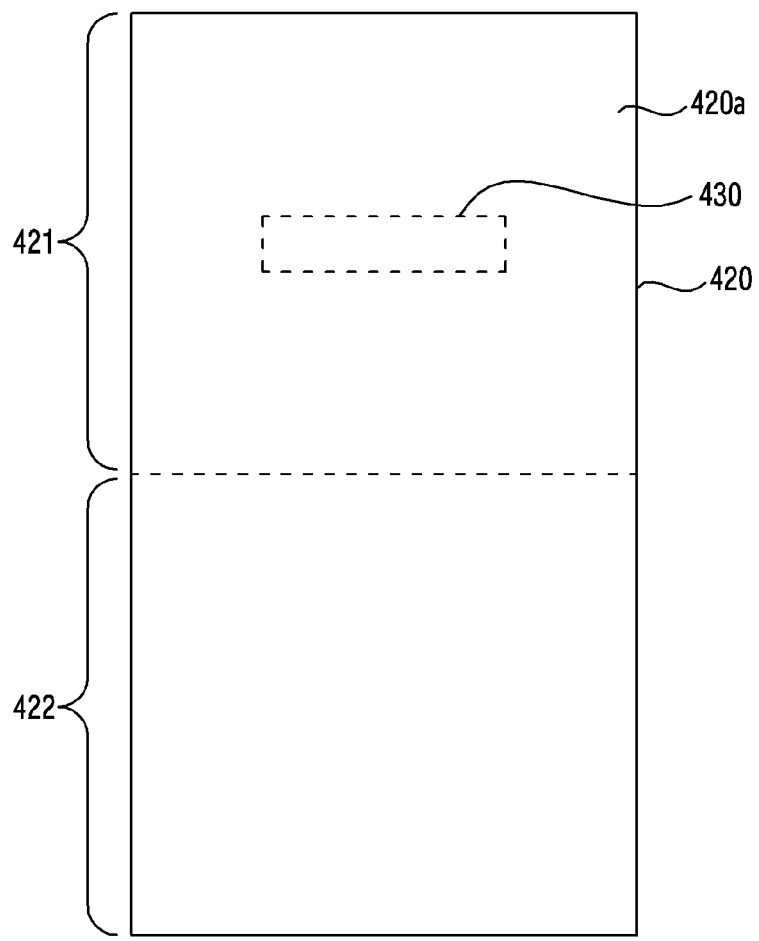
FIG. 4A is a top view illustrating a state in which a speaker is disposed on a display panel according to various embodiments of the disclosure.
Figure 4B:
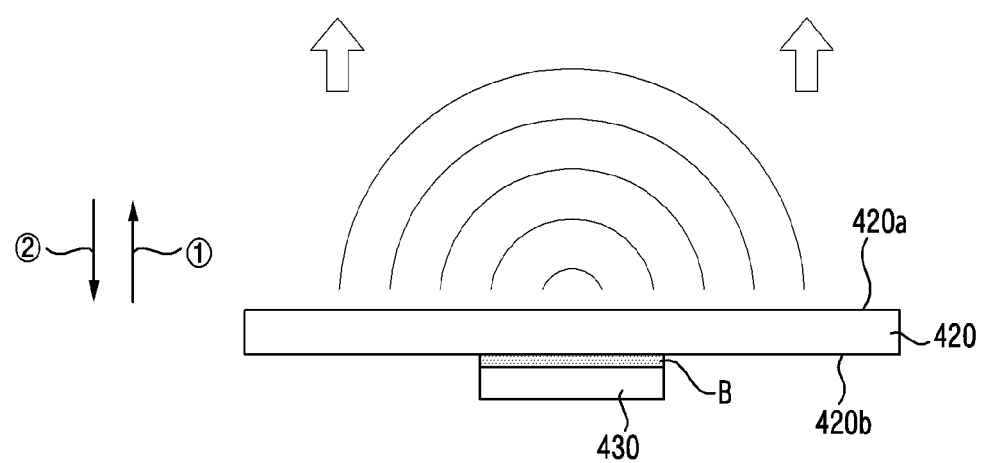
FIG. 4B is a side view illustrating a state in which the speaker is disposed on the display panel and operates according to various embodiments of the disclosure.

FIG. 4A is a top view illustrating a state in which a speaker is disposed on a display panel according to various embodiments of the disclosure. FIG. 4B is a side view illustrating a state in which the speaker is disposed on the display panel and operates according to various embodiments of the disclosure.

Referring to FIGS. 4A and 4B, an electronic device 400 according to various embodiments may include a housing 410. According to an embodiment, the housing may include a display panel 420 and a speaker 430. According to an embodiment, the display panel 420 may include a first surface 420a facing in a first direction (①), and a second surface 420b facing in a second direction (②) opposite to the first direction (①).

According to an embodiment, the display panel 420 is a panel of a thin film type such as a film, and may be formed with a rigid material or a flexible material. According to an embodiment, the display panel 420 may be formed in a flat or curved shape or a combination thereof. For example, the display panel 420 may include an OLED.

According to an embodiment, the display panel 420 may include an upper region 421 and a lower region 422. According to an embodiment, the speaker 430 may be disposed in the upper region 421, but is not limited thereto and may be disposed in the lower region, a middle region, or an edge region of the electronic device. When the speaker 430 is mounted on the display panel 420, the speaker may be referred to as a display panel speaker.

According to an embodiment, the display panel 420 may have the speaker 430 disposed on the second surface 420b. The speaker 430 may be attached to the second surface 420b by a bonding material B such as a tape. When the speaker 430 operates, generated vibration may be transmitted to the display panel 420, and the transmitted vibration may be directed in the first direction (①) by the display panel 420. For example, the speaker 430 may include one or more thin film speakers 430 formed with a piezoelectric material, as a piezoelectric material. According to an embodiment, when the speaker 430 operates, the speaker 430 may generate vibration having directivity in the first direction (①).

Figure 5:
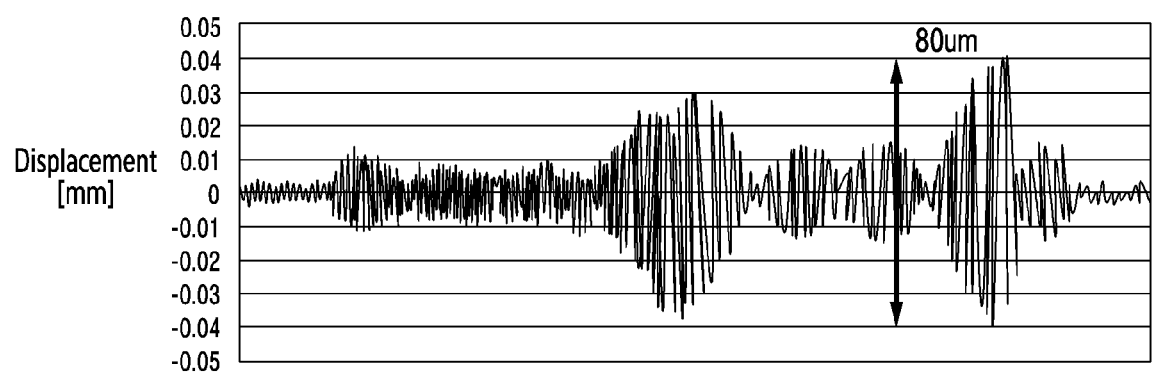
FIG. 5 is a graph illustrating a result of measuring displacement of vibration of a display panel according to various embodiments of the disclosure.

FIG. 5 is a graph illustrating a result of measuring absolute displacement of a speaker attached to a display panel according to various embodiments of the disclosure.

Referring to FIG. 5, when the speaker (for example, the speaker 430 shown in FIG. 4A) attached to the display panel (for example, the display panel 420 shown in FIG. 4A) according to an embodiment operates, displacement between a maximum wavelength and a minimum wavelength of the speaker 430 may be approximately 80 μm.

To reproduce music of the electronic device according to an embodiment, displacement was measured with reference to a time at which the greatest displacement occurs by reproducing a signal of a frequency band (20 Hz to 20 kHz) of the speaker 430. Displacement of a peripheral portion of the display panel to which the speaker is attached was measured, and it can be seen that the displacement is about 80 μm with reference to a point having the greatest displacement.

Figure 6A:
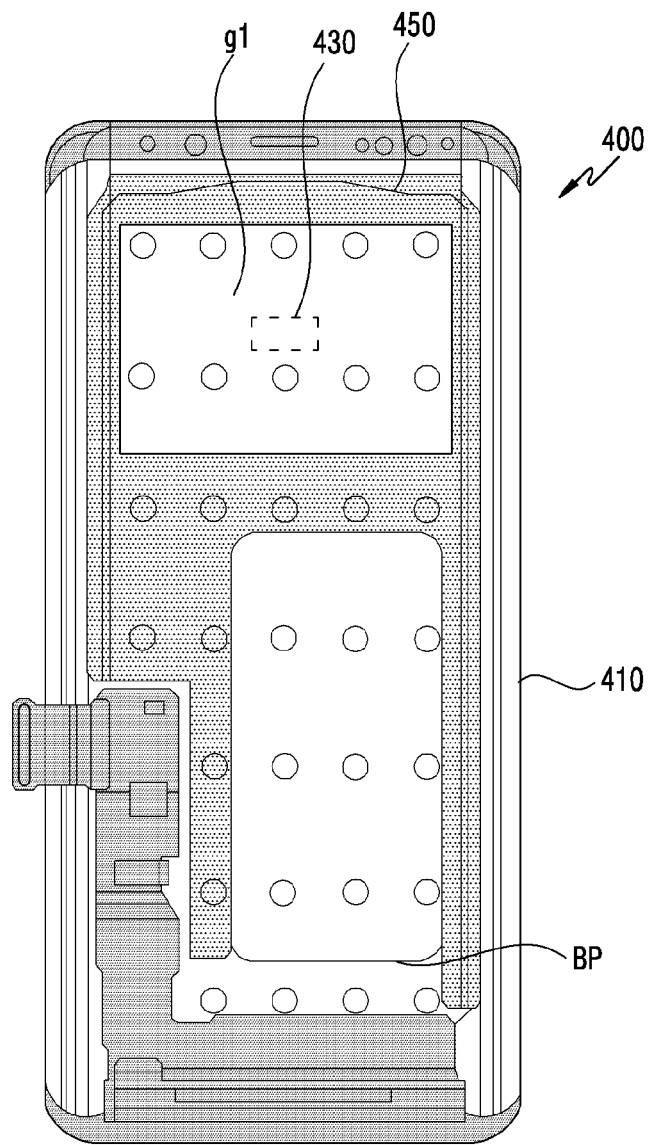
FIG. 6A is a top view illustrating an electronic device having a bonding layer attached thereto according to various embodiments of the disclosure.
Figure 6B:
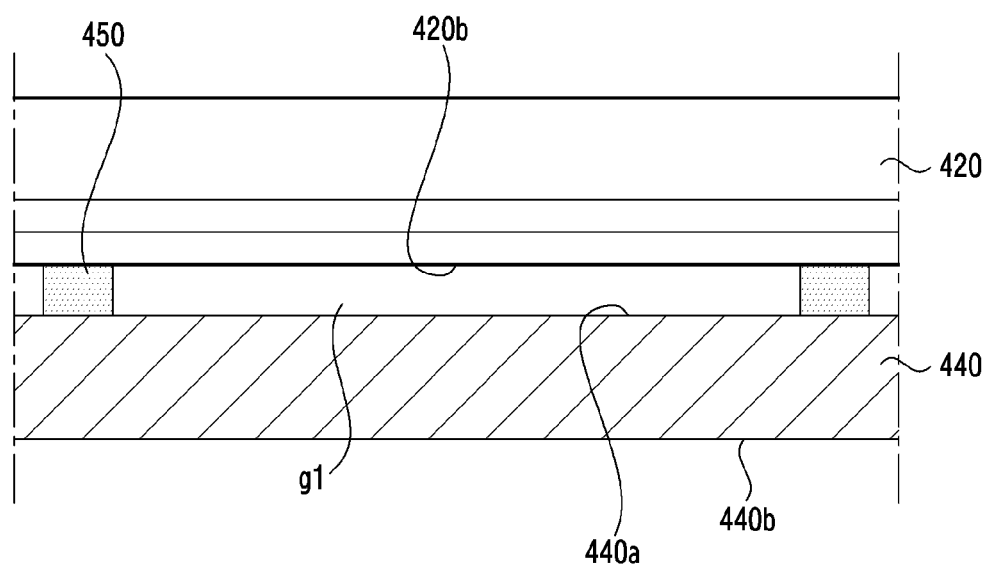
FIG. 6B is a cross-sectional view illustrating a coupling structure between a display panel and a bracket according to various embodiments of the disclosure.

FIG. 6A is a top view illustrating an electronic device to which a bonding layer is attached according to various embodiments of the disclosure. FIG. 6B is a cross-sectional view illustrating a coupling structure between a display panel and a bracket according to various embodiments of the disclosure.

Referring to FIGS. 6A and 6B, the electronic device 400 according to various embodiments may include a display panel (for example, the display panel 420 shown in FIG. 4A), a speaker 430 attached to a second surface of the display panel 420, a bracket 440, and a bonding layer 450. According to an embodiment, the electronic device 400 may have the display panel 420, the bonding layer 450, and the bracket 440 which are stacked one on another. According to an embodiment, the bonding layer 450 may be disposed in a second direction (for example, the second direction (②) shown in FIG. 4B) of the display panel 420, and the bracket 440 may be disposed in the second direction (②) of the bonding layer 450. According to an embodiment, the electronic device 400 may have the display panel 420 and the bracket 440 bonded to each other by the bonding layer 450. For example, the bonding layer 450 may include a double-sided tape. One surface of the bonding layer 450 may be attached to the display panel 420 and the other surface may be attached to the bracket 440.

According to an embodiment, the display panel 420 is configured as a thin film type OLED. Therefore, at least some regions of the display panel 420, that is, some regions to which the speaker 430 is attached, may serve as a vibration plate to which vibration is transmitted as the speaker 430 vibrates. According to an embodiment, the bonding layer 450 may include a portion which is removed and a portion which is not removed. According to an embodiment, the bonding layer 450 that is not removed may be related to a function of attaching the display panel 420 and the bracket 440 to each other, and may be related to performance of an antenna as a spacer for maintaining a gap between the display panel 420 and the bracket 440, that is, propagation performance. According to an embodiment, the bonding layer 450 may perform a bumper function to prevent a damage to the display panel 420 caused by impact occurring when the electronic device 400 drops down.

According to an embodiment, the bonding layer 450 may have a first thickness, and may be disposed between the display panel 420 and the bracket 440 and may have some regions removed. According to an embodiment, a bonding structure between the display panel 420 and the bracket 440, that is, a portion of the bonding layer 450, may be removed to reduce vibration stiffness of the display panel 420.

According to an embodiment, a gap g1 may be formed due to the removed portion of the bonding layer 450. The gap g1 according to an embodiment may be positioned between the second surface 420*b* of the display panel 420 and a first surface 440*a* of the bracket 440 as an opening in a layer form.

According to an embodiment, the gap g1 which is the removed portion of the bonding layer 450 may receive a speaker (for example, the speaker 430 shown in FIG. 6A). Vibration stiffness of the display panel 420 may be reduced by removing a portion of the bonding layer 450. Accordingly, the display panel 420 can achieve better acoustic performance in a low frequency band with a smaller force than before a portion of the bonding layer 450 is removed. According to an embodiment, the gap g1 can enhance acoustic performance of the low frequency band of the speaker 430. For example, the low frequency band may be between 200 Hz and 1 KHz.

According to an embodiment, when viewed above a first plate (for example, the front surface plate 102 shown in FIG. 1), the gap g1 may cover the speaker 430 and a surrounding region of the speaker 430, and may be substantially rectangular. However, the shape of the gap g1 is not limited to the rectangle and may be formed in various shapes. According to an embodiment, the gap g1 may have the same thickness as that of the bonding layer 450. The thickness of the gap g1 may be approximately 100 μm.

According to an embodiment, the bracket 440 may be a support member supporting the display panel 420, and may be coupled with a side surface member (for example, the side surface member 118 shown in FIG. 1), and may be formed with a metallic material, for example, an aluminum material. According to an embodiment, the bracket 440 may be disposed between the display panel 420 and a second plate (for example, the rear surface plate 111 shown in FIG. 2). According to an embodiment, the bracket 440 may include a first surface 440*a* facing in the first direction (①), and the second surface 440*b* facing in the second direction (②) opposite to the first direction (①). The first surface 440*a* may support the display panel 420 disposed thereabove. The reference sign BP may indicate a region in which a battery pack is disposed.

Figure 7A:
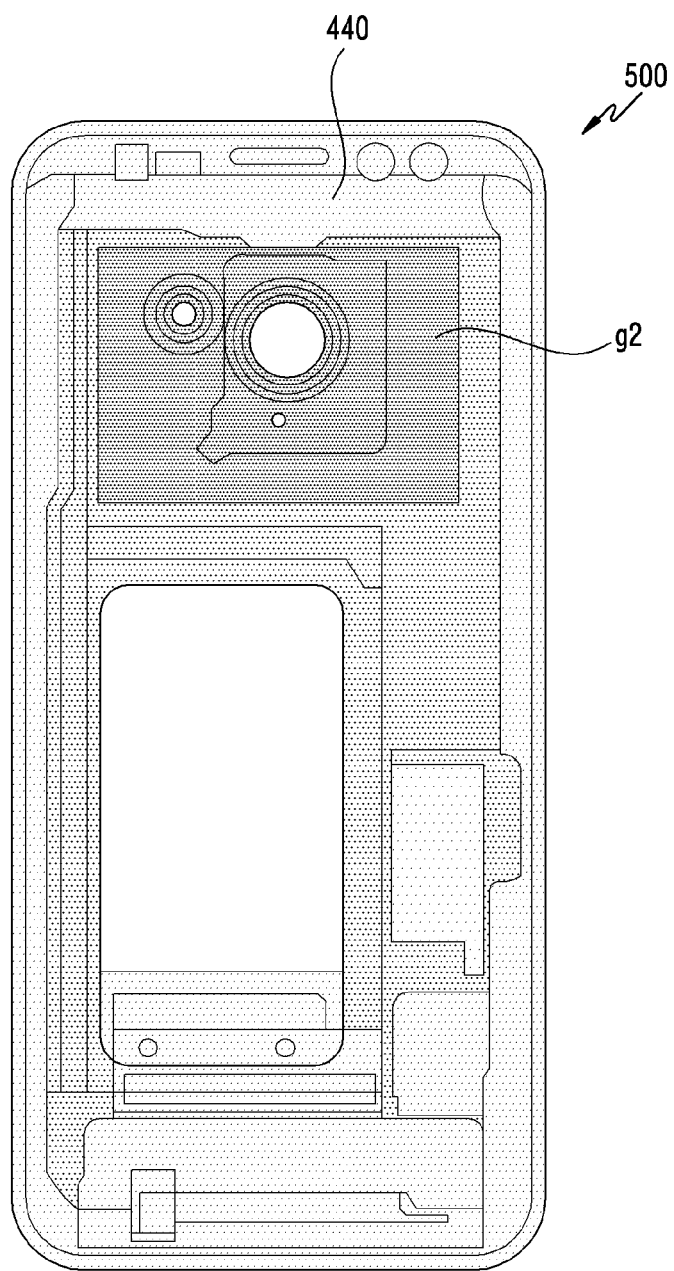
FIG. 7A is a top view illustrating an electronic device having a bonding layer attached thereto according to various other embodiments of the disclosure.
Figure 7B:
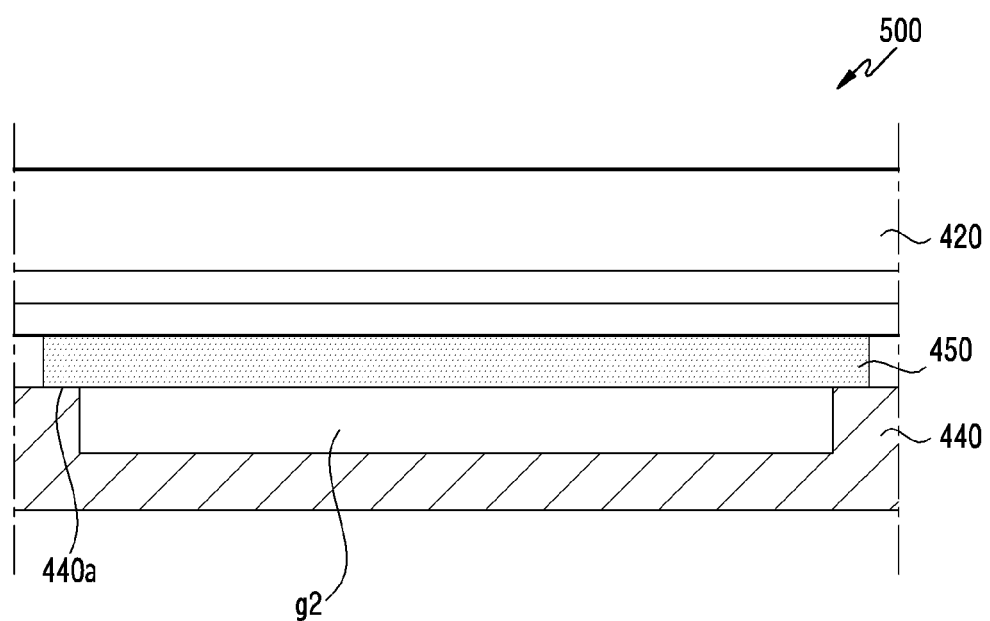
FIG. 7B is a cross-sectional view illustrating a coupling structure between a display panel and a bracket according to various other embodiments of the disclosure.

FIG. 7A is a top view illustrating an electronic device to which a bonding layer is attached according to various other embodiments of the disclosure. FIG. 7B is a cross-sectional view illustrating a coupling structure between a display panel and a bracket according to various other embodiments of the disclosure.

Referring to FIGS. 7A and 7B, the same elements of the electronic device 500 according to various embodiments as those of the electronic device 400 shown in FIGS. 6A and 6B will not be described and only different elements will be described.

Compared to the electronic device 400 shown in FIGS. 6A and 6B, the electronic device 500 according to various embodiments may differ therefrom in a forming position of a gap g2. According to an embodiment, the electronic device 500 may include the display panel 420, the bonding layer 450, the bracket 440, and the gap g2.

According to an embodiment, the bonding layer 450 may have a first thickness, and may be disposed between the display panel 420 and the bracket 440. According to an embodiment, a contact structure between the display panel 420 and the bracket 440, that is, a portion of the bracket 440, may be removed to reduce vibration stiffness of the display panel 420.

According to an embodiment, the gap g2 may be formed by removing a portion of the first surface 440*a* of the bracket 440. The gap g2 according to an embodiment may be a recess in a layer shape, and may be positioned between the display panel 420 and the first surface 440*a* of the bracket 440.

According to an embodiment e vibration stiffness of the display panel 420 may further be reduced through the gap g2 which is the removed portion of the bracket 440. Accordingly, better acoustic performance can be achieved in a low-frequency band of the speaker according to an operation of the speaker (for example, the speaker 430 shown in FIG. 4A).

According to an embodiment, when viewed above the first plate (for example, the front surface plate 102 shown in FIG. 1), the gap g2 may cover the speaker 430 and a surrounding region of the speaker 430, and may be substantially rectangular. However, the shape of the gap g2 is not limited to the rectangle and may be formed in various shapes. According to an embodiment, the thickness of the gap g2 may be approximately 100 μm.

Figure 8:
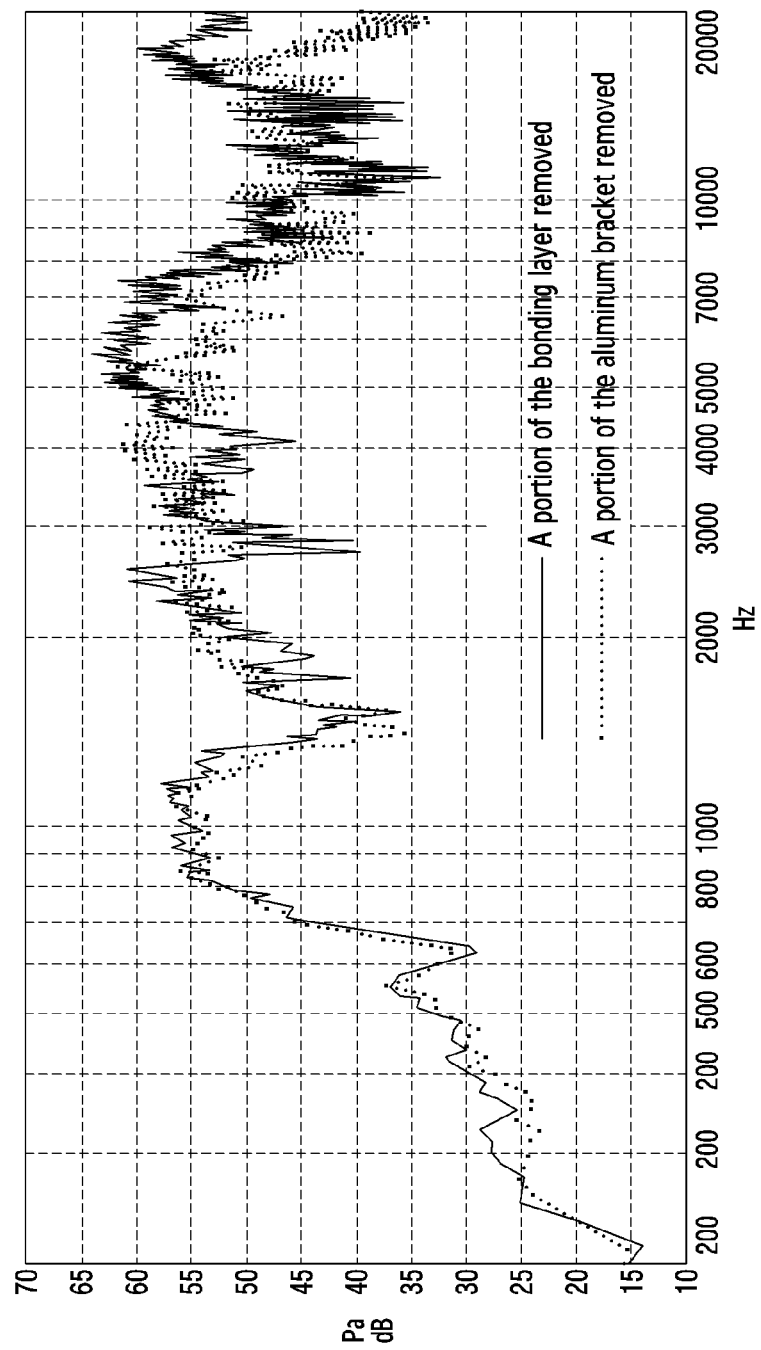
FIG. 8 is a graph illustrating comparison of acoustic performance of a speaker a portion of a bonding layer is removed and acoustic performance when a portion of a bracket is removed according to various embodiments of the disclosure.

FIG. 8 is a graph illustrating comparison of acoustic performance of the speaker when a portion of the bonding layer is removed, and acoustic performance when a portion of the bracket is removed according to various embodiments of the disclosure.

Referring to FIG. 8, acoustic performance of a low frequency band in an embodiment in which the gap g1 is formed by removing a portion of the bonding layer (for example, the bonding layer 450 shown in FIG. 6B), and acoustic performance of a low frequency in an embodiment in which the gap g2 is formed by removing a portion of the first surface 440*a* of the bracket of an aluminum material (for example, the bracket 440 shown in FIG. 7B) may be similar to each other.

Figure 9:
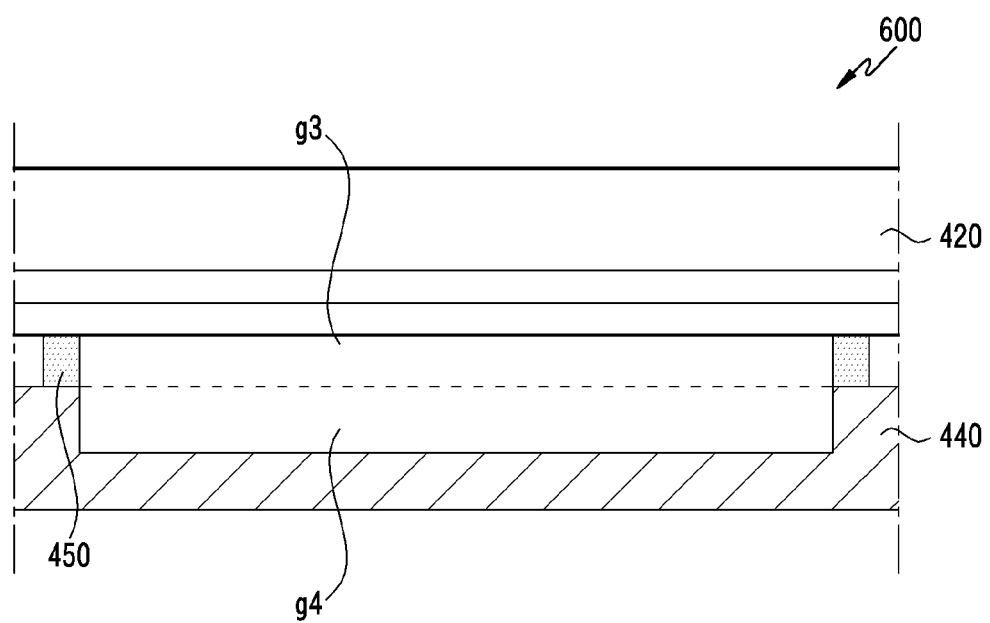
FIG. 9 is a cross-sectional view illustrating a coupling structure between a display panel and a bracket according to various other embodiments of the disclosure.

FIG. 9 is a cross-sectional view illustrating a coupling structure between a display panel and a bracket according to various other embodiments of the disclosure.

Referring to FIG. 9, an electronic device 600 according to various embodiments may be formed in a structure combining the gap g1 formed in the electronic device 400 shown in FIGS. 6A and 6B, and the gap g2 formed in the electronic device 500 shown in FIGS. 7A and 7B. The same elements of the electronic device 600 according to an embodiment as those of the electronic device 400 shown in FIGS. 6A and 6B and the electronic device 500 shown in FIGS. 7A and 7B will not be described, and only different elements will be described.

The electronic device 600 according to an embodiment may include the display panel 420, the bonding layer 450, the bracket 440, a first gap g3 and a second gap g4.

The first gap g3 according to an embodiment may be formed by deleting a portion of the bonding layer 450, and may be formed between the display panel 420 and the bracket 440. According to an embodiment, the second gap g4 may be formed by deleting the first surface 440a of the bracket 440, and may be formed between the bonding layer 450 and the bracket 440. The first gap g3 may include an opening in a layer shape, and the second gap g4 may include a recess which is recessed on the first surface 440a of the bracket 440 in the form of a layer. According to an embodiment, the first and second gaps g3, g4 may be stacked vertically and may be spatially connected with each other. A sum of thicknesses of the first and second gaps g3, g4 may be approximately 100 μm. For example, the first gap g3 may be approximately 50 μm, and the second gap g4 may be approximately 50 μm.

Figure 10:
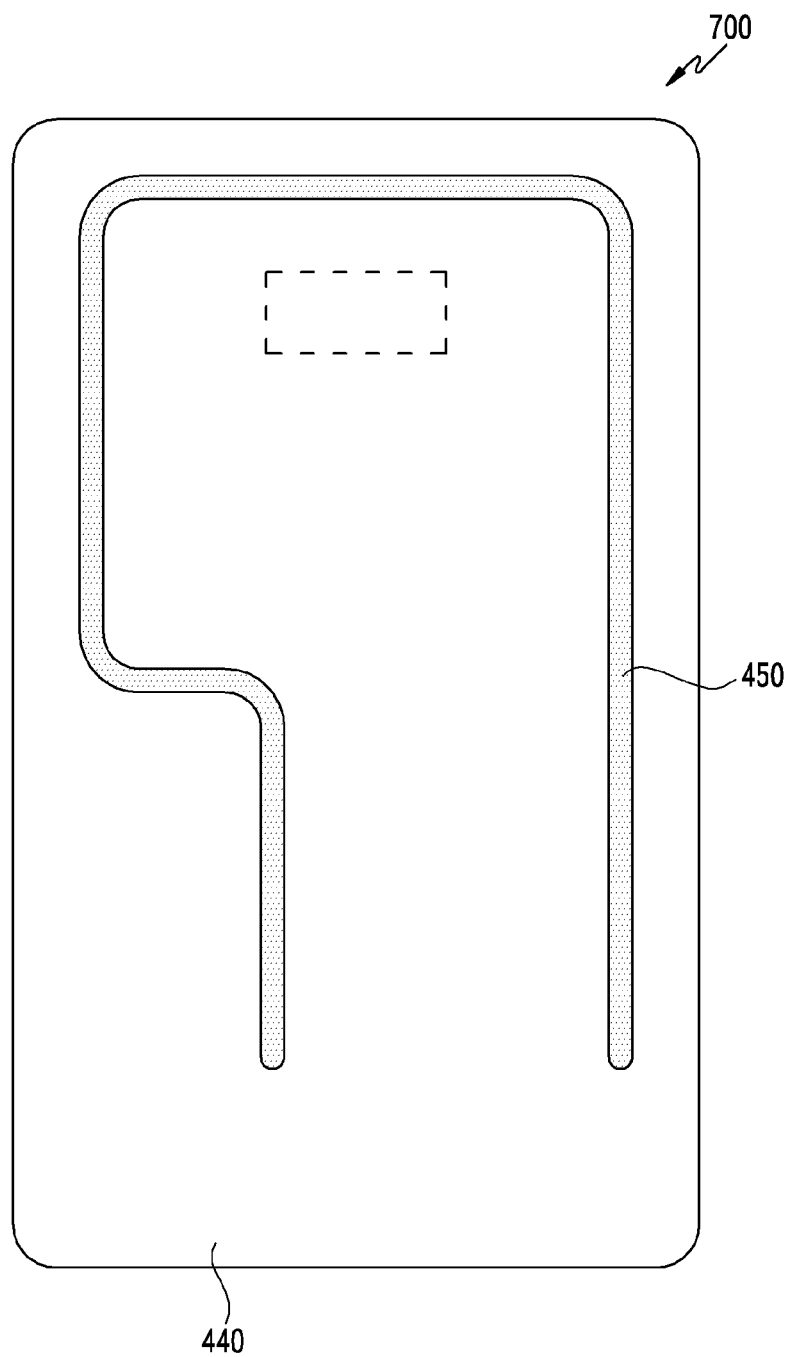
FIG. 10 is a top view illustrating an electronic device having another bonding layer attached thereto according to various embodiments of the disclosure.

FIG. 10 is a top view illustrating an electronic device to which another bonding layer is attached according to various embodiments of the disclosure.

Referring to FIG. 10, the electronic device 700 according to various embodiments may differ from the electronic device 400 shown in FIG. 6A in a shape of a removed portion of the bonding layer 450.

According to an embodiment, the removed region of the bonding layer 450 may be extended to a lower region of the bracket 440. According to an embodiment, the removed region of the bonding layer 450 may have a certain region shape, and as more regions are removed, vibration stiffness of the panel may be more reduced.

According to an embodiment, the removed region of the bonding layer 450 should avoid a symmetrical shape in the horizontal direction and the vertical direction. This is because performance of the speaker abruptly deteriorates in a specific frequency band due to characteristics of the display panel speaker which generates a sound through vibration of the display panel.

This is because, when sizes of regions having opposite phases in a specific vibration mode of the display panel are similar to each other, they may be offset and energy generating a sound is abruptly reduced. This is equally applied to a case in which the bracket is removed (for example, the second gap g2 shown in FIG. 7B), and a case in which a gap is formed by using the bonding layer and the bracket simultaneously (for example, the first and second gaps g3, g4 shown in FIG. 9).

Figure 11:
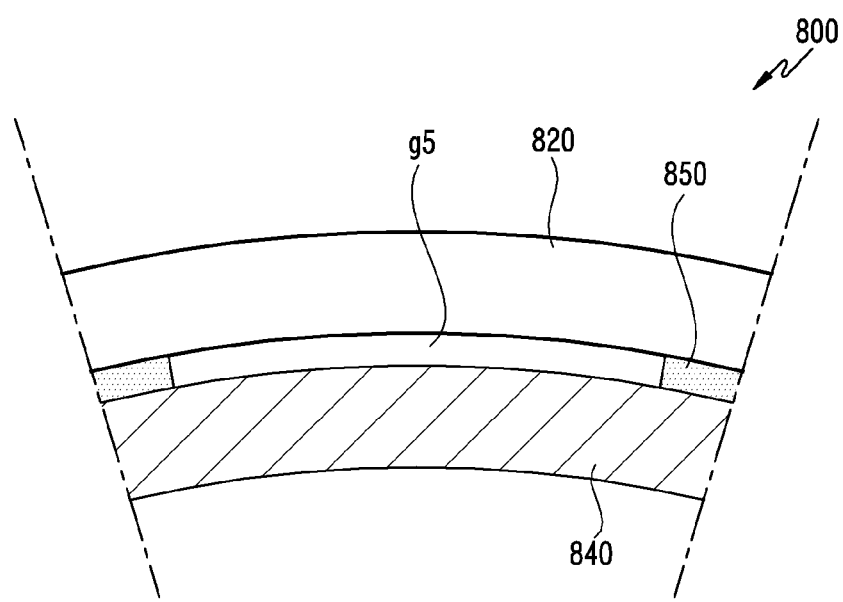
FIG. 11 is a cross-sectional view illustrating a coupling structure between a display panel and a bracket according to various other embodiments of the disclosure.

FIG. 11 is a cross-sectional view illustrating a coupling structure between a display panel and a bracket according to various other embodiments of the disclosure.

Referring to FIG. 11, the same elements of an electronic device 800 according to various embodiments as those of the electronic device 400 shown in FIGS. 6A and 6B will not be described and only different elements will be described.

The electronic device 800 according to an embodiment may include a curved display panel 820, a curved bracket 840, a bonding layer 850, and a gap g5. The bonding layer 850 may attach the curved display panel 820 and the curved bracket 840 to each other.

The bonding layer 850 according to an embodiment may have the gap g5 formed by removing some region thereof. The removed region of the bonding layer 850 may be formed as an opening in a layer form. According to an embodiment, the gap g5 may be formed in a curved shape. According to an embodiment, a curved gap structure having the curved gap g5 for bonding to a region of the curved display panel 820 formed on an edge region may be formed on the display panel 820 of the electronic device 800.

According to an embodiment, the curved display panel 820, the curved bracket 840, the bonding layer 850, and the gap g5 may have respective radii of curvature.

Figure 12:
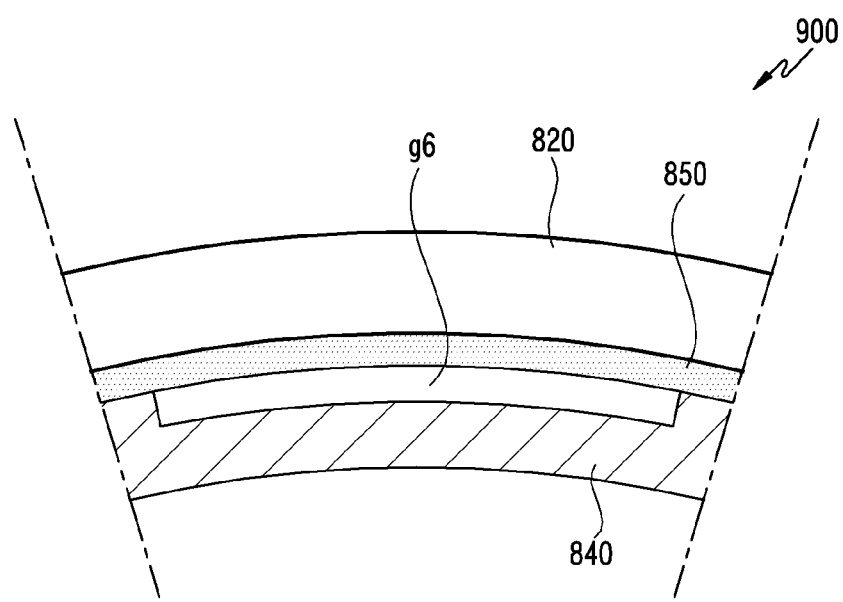
FIG. 12 is a cross-sectional view illustrating a coupling structure between a display panel and a bracket according to various other embodiments of the disclosure.

FIG. 12 is a cross-sectional view illustrating a coupling structure between a display panel and a bracket according to various other embodiments of the disclosure.

Referring to FIG. 12, the same elements of an electronic device 900 according to various embodiments as those of the electronic device 500 shown in FIGS. 7A and 7B will not be described and only different elements will be described.

The electronic device 900 according to an embodiment may include a curved display panel 920, a curved bracket 940, a bonding layer 950, and a gap g6. The bonding layer 950 may attach the curved display panel 920 and the curved bracket 940 to each other.

The bracket 940 according to an embodiment may have the gap g6 formed by removing some region thereof. The removed region of the bracket 940 may be formed as an opening in a layer form. According to an embodiment, the gap g6 may be formed in a curved shape. According to an embodiment, a curved gap structure having the curved gap g6 formed on the bracket 940 may be formed on a region of the curved display panel 920 formed on an edge region of the electronic device 900.

According to an embodiment, the curved display panel 920, the curved bracket 940, the bonding layer 950, and the gap g6 may have respective radii of curvature.

According to an embodiment, an electronic device (for example, the electronic device 400 shown in FIG. 6A) may include: a housing (for example, the housing 110 shown in FIG. 1) including a first plate (for example, the first plate 102 shown in FIG. 1) facing in a first direction (for example, the first direction (①) shown in FIG. 4B), a second plate (for example, the second plate 111 shown in FIG. 2) facing in a second direction (for example, the second direction (②) shown in FIG. 4B) opposite to the first direction, and a side surface member (for example, the side surface member 118 shown in FIG. 1) surrounding at least a portion of a space between the first and second plates; a display panel (for example, the display panel 420 shown in FIG. 6B) disposed in the second direction of the first plate (for example, the first plate 102 shown in FIG. 1), and visually disposed through at least a portion of the first plate (for example, the first plate 102 shown in FIG. 1); a speaker (for example, the speaker 430 shown in FIG. 6A) disposed on one surface of the display panel facing in the second direction; a bracket (for example, the bracket 440 shown in FIG. 6B) including a first surface facing in the first direction and a second surface facing in the second direction, and disposed between the first and second plates to support the display panel disposed on the first surface; and a bonding layer (for example, the bonding layer 450 shown in FIG. 6B) having a first thickness and configured to attach the display panel and the bracket, and the bonding layer may include a gap (for example, the gap g1 shown in FIG. 6B) which is formed by deleting a portion of the bonding layer to receive the speaker, and is formed between the display panel and the bracket.

According to an embodiment, the gap (for example, the gap g1 shown in FIG. 6B) may include an opening in a layer shape.

According to an embodiment, the gap (for example, the gap g1 shown in FIG. 6B) may cover a surrounding region of the speaker (for example, the speaker 430 shown in FIG. 6A) when viewed above the first plate (for example, the first plate 102 shown in FIG. 1).

According to an embodiment, the gap (for example, the gap g1 shown in FIG. 6B) may be substantially rectangular when viewed above the first plate (for example, the first plate 102 shown in FIG. 1).

According to an embodiment, the gap (for example, the gap g1 shown in FIG. 6B) may enhance performance of the speaker in a low frequency band by reducing a stiffness of the display panel.

According to an embodiment, the low frequency band may be between 200 Hz and 1 KHz.

According to an embodiment, the gap (for example, the gap g1 shown in FIG. 6B) may be approximately 100 μm.

According to an embodiment, the bonding layer (for example, the bonding layer 450 shown in FIG. 6B) may maintain propagation performance by maintaining a gap between the display panel (for example, the display panel 420 shown in FIG. 6B) and the bracket (for example, the bracket 440 shown in FIG. 6B).

According to an embodiment, the speaker (for example, the speaker 430 shown in FIG. 6B) may include a piezoelectric speaker.

According to an embodiment, the display panel (for example, the display panel 420 shown in FIG. 6B) may include an OLED panel.

According to an embodiment, an electronic device (for example, the electronic device 500 shown in FIG. 7A) may include: a housing (for example, the housing 410 shown in FIG. 6A) including a first plate (for example, the first plate 102 shown in FIG. 1) facing in a first direction (for example, the first direction ($\hat{1}$) shown in FIG. 4B), a second plate (for example, the second plate 111 shown in FIG. 2) facing in a second direction (for example, the second direction ($\hat{2}$) shown in FIG. 4B) opposite to the first direction, and a side surface member (for example, the side surface member 118 shown in FIG. 1) surrounding at least a portion of a space between the first and second plates; a display panel (for example, the display panel 420 shown in FIG. 6B) disposed in the second direction of the first plate (for example, the first plate 102 shown in FIG. 1), and visually disposed through at least a portion of the first plate (for example, the first plate 102 shown in FIG. 1); a speaker (for example, the speaker 430 shown in FIG. 6A) disposed on one surface of the display panel facing in the second direction; a bracket (for example, the bracket 440 shown in FIG. 7B) including a first surface facing in the first direction and a second surface facing in the second direction, and disposed between the first and second plates to support the display panel disposed on the first surface; and a bonding layer (for example, the bonding layer 450 shown in FIG. 6B) having a first thickness and configured to attach the display panel and the bracket, and the bracket may include a gap (for example, the gap g2 shown in FIG. 7B) which is formed by deleting a portion of the bracket to receive the speaker, and is formed between the bonding layer and the bracket.

According to an embodiment, the gap (for example, the gap g2 shown in FIG. 7B) may include a recess which is recessed on the first surface of the bracket (for example, the bracket 440 shown in FIG. 7B) in a layer shape.

According to an embodiment, the gap (for example, the gap g2 shown in FIG. 7B) may cover a surrounding region of the speaker (for example, the speaker 430 shown in FIG. 6A) when viewed above the first plate (for example, the first plate 102 shown in FIG. 1).

According to an embodiment, the gap (for example, the gap g2 shown in FIG. 7B) may be positioned on an upper portion of the electronic device (for example, the electronic device 400 shown in FIG. 6A) and may be substantially rectangular when viewed above the first plate (for example, the first plate 102 shown in FIG. 1).

According to an embodiment, the gap (for example, the gap g2 shown in FIG. 7B) may provide a space to enhance acoustic performance of the speaker in a low frequency band by reducing a stiffness of the display panel.

According to an embodiment, the bracket (for example, the bracket 440 shown in FIG. 7B) may be formed with an aluminum material.

According to an embodiment, the bonding layer (for example, the bonding layer 450 shown in FIG. 7B) may maintain propagation performance by maintaining a gap between the display panel (for example, the display panel 420 shown in FIG. 7B) and the bracket (for example, the bracket 440 shown in FIG. 7B).

According to an embodiment, an electronic device (for example, the electronic device 600 shown in FIG. 9) may include: a housing including a first plate (for example, the first plate 102 shown in FIG. 1) facing in a first direction, a second plate (for example, the second plate 111 shown in FIG. 2) facing in a second direction opposite to the first direction, and a side surface member surrounding at least a portion of a space between the first and second plates; a display panel (for example, the display panel 420 shown in FIG. 6B) disposed in the second direction of the first plate (for example, the first plate 102 shown in FIG. 1), and visually disposed through at least a portion of the first plate (for example, the first plate 102 shown in FIG. 1); a speaker (for example, the speaker 430 shown in FIG. 6A) disposed on one surface of the display panel facing in the second direction; a bracket (for example, the bracket 440 shown in FIG. 9 including a first surface facing in the first direction and a second surface facing in the second direction, and disposed between the first and second plates to support the display panel disposed on the first surface; a bonding layer (for example, the bonding layer 450 shown in FIG. 9) having a first thickness and configured to attach the display panel and the bracket; a first gap (for example, the gap g3 shown in FIG.) formed by deleting a portion of the bonding layer and formed between the display panel and the bracket; and a second gap (for example, the gap g4 shown in FIG. 9) formed by deleting the first surface of the bracket, and formed between the bonding layer and the bracket.

According to an embodiment, the first gap (for example, the gap g3 shown in FIG. 9) may include an opening in a layer shape, and the second gap (for example, the gap g4 shown in FIG. 9) may include a recess which is recessed on the first surface of the bracket (for example, the bracket 440 shown in FIG.) in a layer shape.

According to an embodiment, the first and second gaps (for example, the gaps g3, g4 shown in FIG. 9) may be stacked vertically, and may be spatially connected with each other.

In the bonding structure between the display panel and the bracket, an assembly structure of the display panel which can reduce vibration stiffness of the display panel is implemented by removing a portion of the bonding layer or a portion of the bracket, such that acoustic performance of the speaker in a low frequency band can be enhanced.

While the disclosure has been shown and described with reference to certain preferred embodiments thereof, it will be understood by those skilled in the art that various changes in form and details may be made therein without departing from the spirit and scope of the invention as defined by the appended claims. Therefore, the scope of the invention is defined not by the detailed description of the invention but by the appended claims, and all differences within the scope will be construed as being included in the present invention.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing comprising:
      a first plate facing in a first direction,
      a second plate facing in a direction opposite to the first direction, and
      a side surface member surrounding at least a portion of a space between the first and second plates;
   a display panel disposed in a second direction of the first plate, the display panel visually disposed through at least a portion of the first plate;
   a speaker disposed on one surface of the display panel, the speaker facing in the second direction;
   a bracket comprising a first surface facing in the first direction and a second surface facing in the second direction, the bracket disposed between the first and second plates to support the display panel disposed on the first surface; and
   a bonding layer having a first thickness, the bonding layer configured to attach the display panel and the bracket,
   wherein the bonding layer comprises a gap, the gap formed by deleting a portion of the bonding layer to receive the speaker, the gap formed between the display panel and the bracket.

2. The electronic device of claim 1, wherein the gap comprises an opening in a layer shape.

3. The electronic device of claim 1, wherein the gap comprises a surrounding region of the speaker when viewed above the first plate.

4. The electronic device of claim 3, wherein the gap is substantially rectangular when viewed above the first plate.

5. The electronic device of claim 1, wherein the gap is configured to enhance acoustic performance of the speaker in a low frequency band by reducing a display panel vibration stiffness of the speaker.

6. The electronic device of claim 5, wherein the low frequency band is between 200 Hz and 1 KHz.

7. The electronic device of claim 1, wherein the gap is approximately 100 μm.

8. The electronic device of claim 1, wherein the bonding layer is configured to maintain propagation performance by maintaining a gap between the display panel and the bracket.

9. The electronic device of claim 1, wherein the speaker comprises a piezoelectric speaker.

10. The electronic device of claim 1, wherein the display panel comprises an OLED panel.

11. An electronic device comprising:
   a housing comprising:
      a first plate facing in a first direction,
      a second plate facing in a direction opposite to the first direction, and
      a side surface member surrounding at least a portion of a space between the first and second plates;
   a display panel disposed in a second direction of the first plate, the display panel visually disposed through at least a portion of the first plate;
   a speaker disposed on one surface of the display panel, the speaker facing in the second direction;
   a bracket comprising a first surface facing in the first direction and a second surface facing in the second direction, the bracket disposed between the first and second plates to support the display panel disposed on the first surface; and
   a bonding layer having a first thickness, the bonding layer configured to attach the display panel and the bracket,
   wherein the bracket comprises a gap formed by deleting a portion of the bracket, the gap configured to receive the speaker, the gap formed between the bonding layer and the bracket.

12. The electronic device of claim 11, wherein the gap comprises a recess which is recessed on the first surface of the bracket in a layer shape.

13. The electronic device of claim 11, wherein the gap comprises a surrounding region of the speaker when viewed above the first plate.

14. The electronic device of claim 13, wherein the gap is positioned on an upper portion of the electronic device and is substantially rectangular when viewed above the first plate.

15. The electronic device of claim 11, wherein the gap is configured to provide a space to enhance acoustic performance of the speaker in a low frequency band by reducing a stiffness of the display panel.

16. The electronic device of claim 11, wherein the bracket is formed with an aluminum material.

17. The electronic device of claim 11, wherein the bonding layer is configured to maintain propagation performance by maintaining a gap between the display panel and the bracket.

18. An electronic device comprising:
   a housing comprising:
      a first plate facing in a first direction,
      a second plate facing in a direction opposite to the first direction, and
      a side surface member surrounding at least a portion of a space between the first and second plates;
   a display panel disposed in a second direction of the first plate, the display panel visually disposed through at least a portion of the first plate;
   a speaker disposed on one surface of the display panel, the speaker facing in the second direction;
   a bracket comprising a first surface facing in the first direction and a second surface facing in the second direction, the bracket disposed between the first and second plates to support the display panel disposed on the first surface;
   a bonding layer having a first thickness, the bonding layer configured to attach the display panel and the bracket;

a first gap formed by deleting a portion of the bonding layer, the first gap formed between the display panel and the bracket; and a second gap formed by deleting the first surface of the bracket, the second gap formed between the bonding layer and the bracket.

19. The electronic device of claim 18, wherein the first gap comprises an opening in a layer shape, wherein the second gap comprises a recess which is recessed on the first surface of the bracket in a layer shape.

20. The electronic device of claim 18, wherein the first and second gaps are stacked vertically, wherein the first and second gaps are spatially connected with each other.

* * * * *